United States Patent
Ueno et al.

(10) Patent No.: US 10,098,289 B2
(45) Date of Patent: Oct. 16, 2018

(54) ILLUMINATION SYSTEM, ILLUMINATION CONTROL METHOD, AND PLANT CULTIVATION DEVICE

(71) Applicant: Panasonic Intellectual Property Management Co., Ltd., Osaka (JP)

(72) Inventors: Yasuharu Ueno, Osaka (JP); Koji Omura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 21 days.

(21) Appl. No.: 15/667,153

(22) Filed: Aug. 2, 2017

(65) Prior Publication Data
US 2018/0035619 A1    Feb. 8, 2018

(30) Foreign Application Priority Data
Aug. 5, 2016 (JP) ................... 2016-154777

(51) Int. Cl.
| | |
|---|---|
| H05B 37/02 | (2006.01) |
| A01G 9/20 | (2006.01) |
| F21V 19/00 | (2006.01) |
| H01L 33/50 | (2010.01) |
| H05B 33/08 | (2006.01) |
| F21Y 113/13 | (2016.01) |

(Continued)

(52) U.S. Cl.
CPC ............ *A01G 9/20* (2013.01); *F21V 19/0015* (2013.01); *H01L 33/507* (2013.01); *H05B 33/0809* (2013.01); *H05B 33/0845* (2013.01); *H05B 37/0281* (2013.01); *F21Y 2113/13* (2016.08); *F21Y 2115/10* (2016.08); *H01L 33/645* (2013.01)

(58) Field of Classification Search
CPC ............ H05B 33/0845; H05B 37/0218; H05B 37/0227; H05B 37/0281; A01G 7/045
USPC .............................. 315/185 R, 297, 309, 360
See application file for complete search history.

(56) References Cited

U.S. PATENT DOCUMENTS

| | | | |
|---|---|---|---|
| 9,084,397 B2 * | 7/2015 | Smith | A01G 5/06 |
| 9,137,874 B2 * | 9/2015 | Maxik | H05B 37/02 |
| 9,538,615 B1 * | 1/2017 | Armstrong | H05B 37/0227 |

(Continued)

FOREIGN PATENT DOCUMENTS

| | | |
|---|---|---|
| JP | 2010-193824 A | 9/2010 |
| JP | 2013-066394 A | 4/2013 |

(Continued)

*Primary Examiner* — Tung X Le
(74) *Attorney, Agent, or Firm* — McDermott Will & Emery LLP

(57) ABSTRACT

An illumination system includes: a light-emitting module including a blue LED light source that emits blue light having a light emission peak in a blue range of from 400 nm to 470 nm and a red LED light source that emits red light having a light emission peak in a red range of from 610 nm to 680 nm; a light regulator that controls a first light intensity, which is light intensity at the light emission peak in the blue range, and a second light intensity, which is light intensity at the light emission peak in the red range, in a light emission spectrum of light emitted by the light-emitting module; and a clock that measures a time. The light regulator causes the second light intensity to change in conjunction with a change in the first light intensity, in accordance with the time measured by the clock.

12 Claims, 7 Drawing Sheets

(51) Int. Cl.
*F21Y 115/10* (2016.01)
*H01L 33/64* (2010.01)

(56) References Cited

U.S. PATENT DOCUMENTS

| | | | | |
|---|---|---|---|---|
| 2003/0009933 | A1* | 1/2003 | Yoneda | A01G 7/045 |
| | | | | 47/1.01 R |
| 2015/0128489 | A1* | 5/2015 | Yamada | A01G 7/045 |
| | | | | 47/58.1 LS |
| 2015/0313091 | A1 | 11/2015 | Ara et al. | |
| 2015/0327446 | A1* | 11/2015 | Kawaguchi | A01G 7/045 |
| | | | | 257/98 |
| 2016/0088802 | A1* | 3/2016 | Nicole | A01G 1/001 |
| | | | | 47/58.1 LS |
| 2016/0262313 | A1* | 9/2016 | Szeto | A01G 7/045 |
| 2017/0030555 | A1* | 2/2017 | Lalicki | F21K 9/64 |
| 2017/0105358 | A1* | 4/2017 | Wilson | A01G 7/045 |

FOREIGN PATENT DOCUMENTS

| | | |
|---|---|---|
| JP | 2013-162757 A | 8/2013 |
| JP | 2014-155436 A | 8/2014 |

\* cited by examiner

ILLUMINATION SYSTEM, ILLUMINATION CONTROL METHOD, AND PLANT CULTIVATION DEVICE

CROSS REFERENCE TO RELATED APPLICATION

This application claims the benefit of priority of Japanese Patent Application Number 2016-154777 filed on Aug. 5, 2016, the entire content of which is hereby incorporated by reference.

BACKGROUND

1. Technical Field

The present disclosure relates to an illumination system, an illumination control method, and a plant cultivation device.

2. Description of the Related Art

Illumination apparatuses for irradiating light necessary for plant cultivation are conventionally known. Illumination apparatuses are mainly provided in indoor plant factories and plant cultivation devices, and used in order to cultivate plants without being affected by seasons or weather, etc.

It is considered that irradiating plants with blue light and red light is good for plant cultivation. As such, illumination apparatuses used in plant cultivation are designed to irradiate plants with light including blue light and red light.

Furthermore, with regard to the ratio of light intensity between the blue light and the red light included in the light irradiated from an illumination apparatus, there is a ratio that is considered good for plant cultivation. In addition, it is known that the aforementioned ratio is different depending on the type or breed of plant. Therefore, illumination apparatuses are designed to irradiate light in which blue light and red light are mixed in a ratio that matches the type or breed of the plant.

Furthermore, there are cases where, depending on the type or breed of plant, the ratio of light intensity between blue light and red light that is required per growth stage is different. As an example of a cultivation method in which the color component of light and the growth stage are taken into consideration, there is a parsley cultivation method (for example, see Japanese Unexamined Patent Application Publication No. 2013-162757 (Patent Literature (PTL) 1)).

In the parsley cultivation method disclosed in PTL 1, a first artificial light source irradiates a light which includes red light having a wavelength of 620 nm to 680 nm and blue light having a wavelength of 400 nm to 480 nm, and which is set so that the red light has a light amount ratio greater than the blue light. Furthermore, a second artificial light source irradiates parsley that has been cultivated to a harvestable size with a light that is set so that the blue light has a light amount ratio greater than or equal to the red light. By doing so, the growth and taste of the parsley can be regulated.

SUMMARY

In the illumination apparatus disclosed in PTL 1, however, there is no means for recognizing the growth stage of the plant, and thus the user has to visually check the growth stage of the plant, and artificially regulate the ratio of light intensity between the blue light and the red light.

In view of this, the present disclosure provides an illumination system, an illumination control method, and a plant cultivation device that are capable of easily regulating the ratio of light intensity between blue light and red light.

An illumination system according to an aspect of the present disclosure includes: a light-emitting module including a blue light-emitting diode (LED) light source that emits blue light and a red LED light source that emits red light, the blue light having a light emission peak in a blue range of at least 400 nm to at most 470 nm, the red light having a light emission peak in a red range of at least 610 nm to at most 680 nm; a light regulator that controls a first light intensity and a second light intensity in a light emission spectrum of light emitted by the light-emitting module, the first light intensity being a light intensity at the light emission peak in the blue range, and the second light intensity being a light intensity at the light emission peak in the red range; and a clock that measures a time, wherein the light regulator causes the second light intensity to change in conjunction with a change in the first light intensity, in accordance with the time measured by the clock.

Furthermore, an illumination control method according to an aspect of the present disclosure includes: lighting-up a light-emitting module including a blue LED light source that emits blue light and a red LED light source that emits red light, the blue light having a light emission peak in a blue range of at least 400 nm to at most 470 nm, the red light having a light emission peak in a red range of at least 610 nm to at most 680 nm; measuring a time from a timepoint at which the lighting-up is executed; and causing a light intensity at the light emission peak of the red light to change in conjunction with a change in a light intensity at the light emission peak of the blue light, in accordance with the time measured in the measuring.

Furthermore, a plant cultivation device according to an aspect of the present disclosure includes: the above-described illumination system, and a container that holds a medium which supports a plant, wherein the light-emitting module irradiates the plant with the light.

An illumination system, etc., according to the present disclosure is capable of easily regulating the ratio of intensity between blue light and red light.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENT

Hereinafter, an illumination system, etc., according to an exemplary embodiment will be described with reference to the Drawings. It should be noted that the exemplary embodiment described below represents a generic or specific example. The numerical values, shapes, materials, structural components, the arrangement and connection of the structural components, etc. shown in the following exemplary embodiment are mere examples, and are not intended to limit the scope of the present disclosure. Furthermore, among the structural components in the following exemplary embodiment, components not recited in any one of the independent claims which indicate the broadest concepts of the present invention are described as arbitrary structural components.

It should be noted that the respective figures are schematic diagrams and are not necessarily precise illustrations. Furthermore, in the respective figures, substantially identical components are assigned the same reference signs, and overlapping description may be omitted or simplified.

Furthermore, in the following exemplary embodiment, the Z-axis direction is, for example, the vertical direction, and there are instances where the Z-axis positive side is referred to as the top side (upside). Furthermore, there are instances where the Z-axis negative side is referred to as bottom side (downside). Furthermore, the X-axis direction and the Y-axis direction are mutually orthogonal directions in a plane (horizontal plane) perpendicular to the Z-axis.

Embodiment

[Configuration of Illumination System and Illumination Apparatus]

Figure 1:
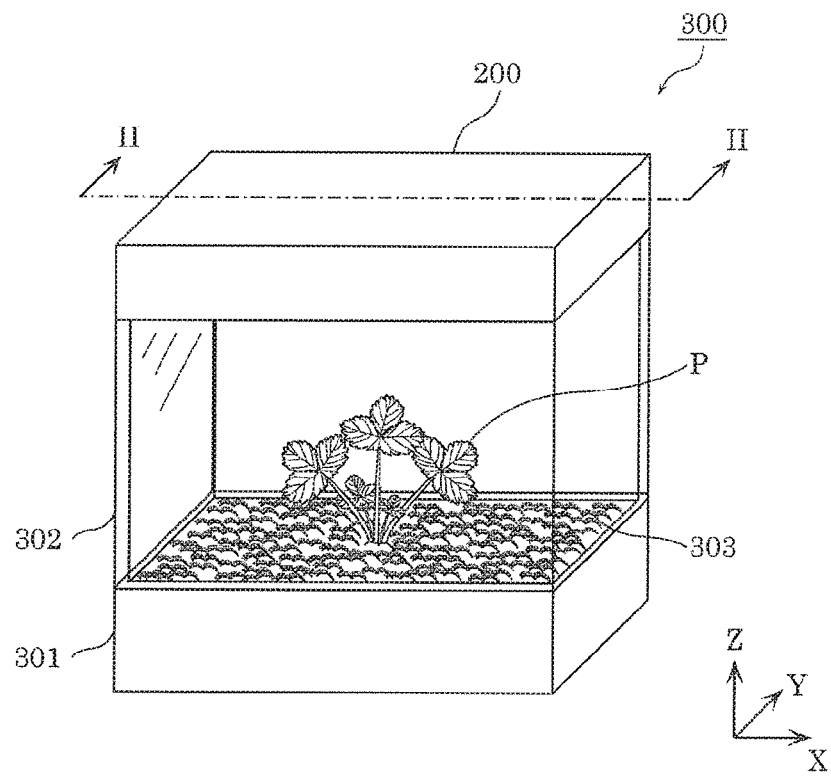
FIG. 1 is a perspective view of the external appearance of a plant cultivation device according to an exemplary embodiment.
Figure 2:
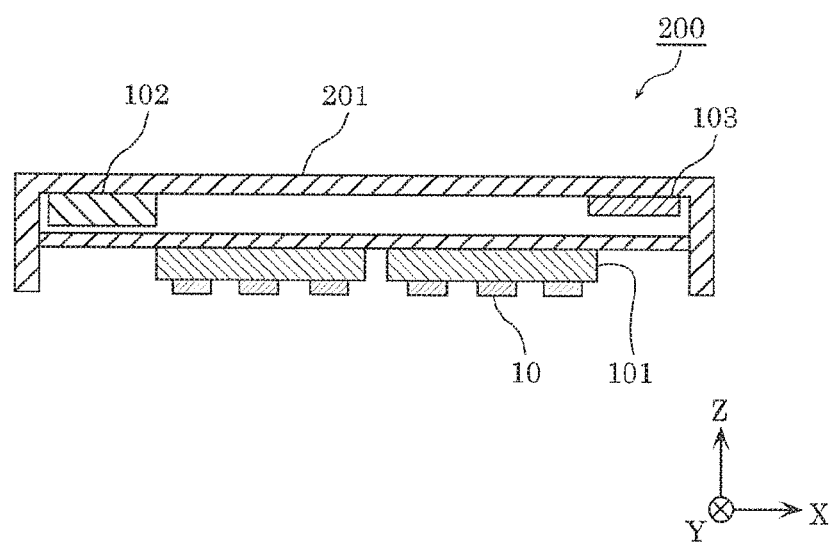
FIG. 2 is a schematic cross-sectional view of an illumination apparatus along line II-II in FIG. 1.
Figure 3:
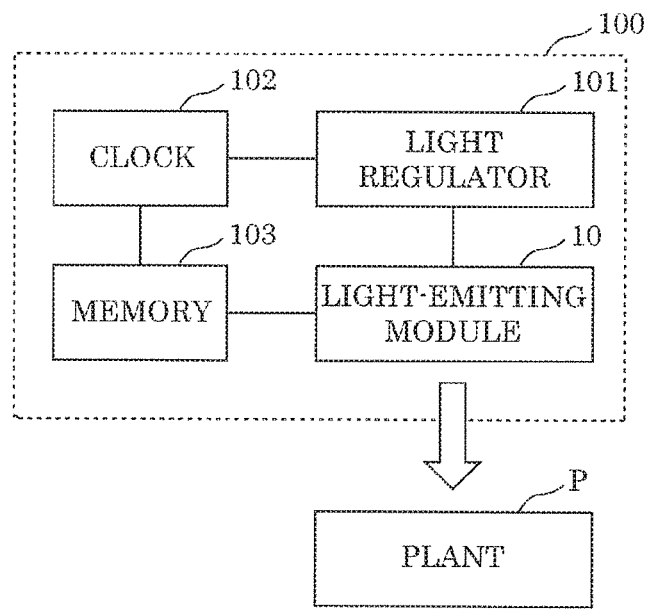
FIG. 3 is a block diagram illustrating an illumination system according to the embodiment.

First, an illumination system and a plant cultivation device according to an embodiment will be described. FIG. 1 is a perspective view of the external appearance of a plant cultivation device according to this embodiment. FIG. 2 is a schematic cross-sectional view of an illumination apparatus along line II-II in FIG. 1. FIG. 3 is a block diagram illustrating an illumination system according to this embodiment. Specifically, FIG. 2 illustrates an illumination apparatus which is a specific example of the illumination system according to this embodiment illustrated in FIG. 3, and FIG. 1 illustrates a plant cultivation device including the illumination apparatus which is a specific example of the illumination system according to this embodiment.

The illumination system according to this embodiment is to be applied to the illumination apparatus, etc., of a plant cultivation device, etc., placed in a plant factory or a house. Furthermore, the illumination system according to this embodiment is to be applied to an illumination apparatus, etc., that irradiates an auxiliary light, in plant cultivation using sunlight such as greenhouse cultivation. In other words, the illumination system according to this embodiment is an illumination system that irradiates plants with light.

As illustrated in FIG. 1, plant cultivation device 300 includes container 301, support component 302, medium 303, plant P, and illumination apparatus 200.

Container 301 is a box body such as an open-topped tray that holds medium 303, etc., in which plant P is planted. Container 301 is made from, for example, a resin material such as plastic, a metal material such as stainless steel, or ceramic, etc. It should be noted that container 301 may be coated with paint, etc., for suppressing the occurrence of rust, etc. Furthermore, container 301 may be of any shape or size.

Support component 302 is a holding component for holding illumination apparatus 200 over plant P which is planted in medium 303. In FIG. 1, support component 302 is a transparent component such as plastic or glass, and is disposed so as to surround the periphery of plant P. It should be noted that the shape and material of support component 302 is not limited as long as illumination apparatus 200 can be supported over (the Z-axis positive side in FIG. 1) plant P.

Medium 303 holds plant P. Medium 303 is, for example, soil. Furthermore, in the case of hydroponics, container 301 holds a liquid (nourishing solution) and medium 303 which serves as a holding component that holds plant P.

Plant P is a plant to be cultivated. Plant P is, for example, a seed, a bulb, a bud, a seedling, etc., of a plant (for example, a plant with roots). Plant P grows roots as it develops, and grows by absorbing nutrients from medium 303 (nourishing solution in the case of hydroponics) from its roots. For example, plant P is a vegetable such as lettuce, a fruit such as strawberries, an ornamental plant, etc.

Illumination apparatus 200 is an apparatus for irradiating plant P with light. As illustrated in FIG. 2, illumination apparatus 200 includes case 201, light-emitting modules 10, light regulators 101, clock 102, and memory 103. FIG. 3 is a block diagram illustrating the characteristic function configuration of illumination system 100. As illustrated in FIG. 3, illumination system 100 includes light-emitting modules 10, light regulators 101, clock 102, and memory 103. It should be noted that the arrow symbol in FIG. 3 indicates the emission direction of light emitted from light-emitting modules 10.

Case 201 holds light-emitting modules 10, light regulators 101, clock 102, and memory 103. Case 201 is made from, for example, a resin material such as plastic, a metal material such as stainless steel, or ceramic, etc. Furthermore, case 201 may be of any shape or size.

Light-emitting modules 10 emit light with which plant P is irradiated. Light-emitting modules 10 include blue LED light sources that emit blue light and red LED light sources that emit red light. Details of light-emitting modules 10 will be described later.

Plant P has chlorophyll (photosynthetic pigment) in its cells, and chlorophyll has the property of absorbing light in the blue wavelength range (blue range) of approximately 400 nm to 470 nm, and light in the red wavelength range (red range) of approximately 610 nm to 680 nm. Specifically, blue light and red light play an important role in the photosynthesis of plant P. As such, illumination system 100 includes one or more light-emitting modules 10 that emit light having the color components of both 400 nm to 470 nm blue light and 610 nm to 680 nm red light. It should be noted that, hereinafter, there are instances where "LED light source(s)" is used as a generic name for referring to the blue LED light sources and the red LED light sources.

Light regulator 101 causes the peak ratio between the blue light and the red light in the light emission spectrum of the light emitted by light-emitting modules 10 to change. Specifically, light regulator 101 controls the temperature of light-emitting modules 10 to thereby simultaneously change both the light intensity of the light emitted by the blue LED light sources and the light intensity of the light emitted by the red LED light sources.

Light regulator 101 includes, for example, a Peltier element, a central processing unit (CPU), and a control program stored in memory 103. Light regulator 101 makes use of the difference in temperature characteristics between the blue LED light sources and the red LED light sources to cause the light intensity of the red LED light sources to change in conjunction with a change in the light intensity of the blue LED light sources, and thereby cause the ratio of light intensity between the blue LED light sources and the red LED light sources to change. The temperature characteristic is the characteristic of the light intensity of light emitted by the LED light sources with respect to temperature.

Clock 102 is a clock that measures the time. Clock 102 is composed of a control circuit equipped with a real time clock (RTC). Light regulator 101 controls the temperature of light-emitting modules 10 in accordance with the time measured by clock 102.

Meanwhile, there are instances where, depending on the type of plant, there are stages in the growth of the plant. For example, strawberries have a seedling raising stage for raising seedlings, a flowering stage for blooming of flowers, a fruition stage in which flowers bear fruit, and a harvesting stage in which the fruit is harvested. Furthermore, changing the ratio of light intensity between the blue LED light sources and the red LED light sources in accordance with each of the growth stages, can positively impact the growth of the plant. Furthermore, the growth of plant P is such that, as long as the breed is the same and the cultivation conditions are the same, the growth is substantially the same. In other words, the growth stage of plant P can be estimated approximately using the elapsed time from the point in time at which cultivation was started. As such, light regulator 101 estimates the growth stage of the plant from the time measured by clock 102, and controls light-emitting modules 10 in accordance with the estimated growth stage.

Memory 103 is a memory that stores the time measured by clock 102, the timing at which light regulator 101 causes the light intensities of the light emitted from the blue LED light sources and the red LED light sources to change, etc. Memory 103 is, for example, a read only memory (ROM) or a random access memory (RAM).

Next, light-emitting modules 10 will be described.

Figure 4:
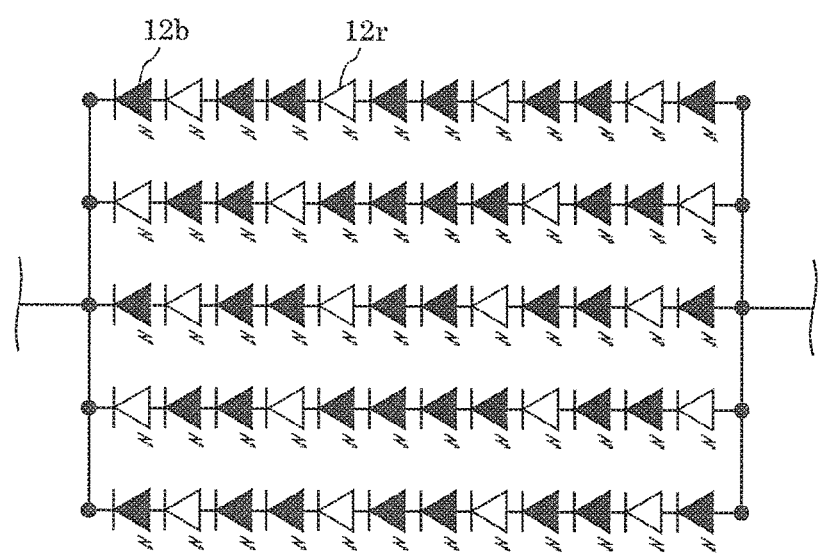
FIG. 4 is a circuit diagram illustrating a light-emitting module according to the embodiment.

FIG. 4 is a schematic diagram illustrating an example of the circuit structure of a light-emitting module according to this embodiment. Specifically, FIG. 4 is a circuit diagram illustrating the arrangement pattern of the blue LED light sources and the red LED light sources in each light-emitting module 10.

As illustrated in FIG. 4, a plurality of blue LED light sources 12b and red LED light sources 12r are connected in series in light-emitting module 10. Furthermore, a plurality of columns having the same number of blue LED light sources 12b and red LED light sources 12r are connected in parallel in light-emitting module 10.

For example, as illustrated in FIG. 4, in light-emitting module 10, five light-emitting element columns each including 12 serially connected blue LED light sources 12b and red LED light sources 12r are provided on board 11. In addition, these five light-emitting element columns are connected in parallel.

Furthermore, one light-emitting element column out of the five light-emitting element columns includes at least one each of blue LED light sources 12b and red LED light sources 12r. In other words, in one of the light-emitting element columns, a blue LED light source 12b and a red LED light source 12r are connected in series. In addition, one light-emitting element column includes the same number of blue LED light source 12b as the other light-emitting element columns and the same number of red LED light source 12r as the other light-emitting element columns. Accordingly, the total Vf (total forward voltage) of the LED light sources in each of the light-emitting element columns can be made uniform, and the configuration of a lighting device (not illustrated) for causing light-emitting module 10 to light up can be simplified.

In the example of light-emitting module 10 illustrated in FIG. 4, the number of blue LED light sources 12b included in one light-emitting element column is eight, and the number of red LED light sources 12r included in one light-emitting element column is four.

Next, the temperature characteristics of the LED light sources of light-emitting modules 10 will be described.

Figure 5:
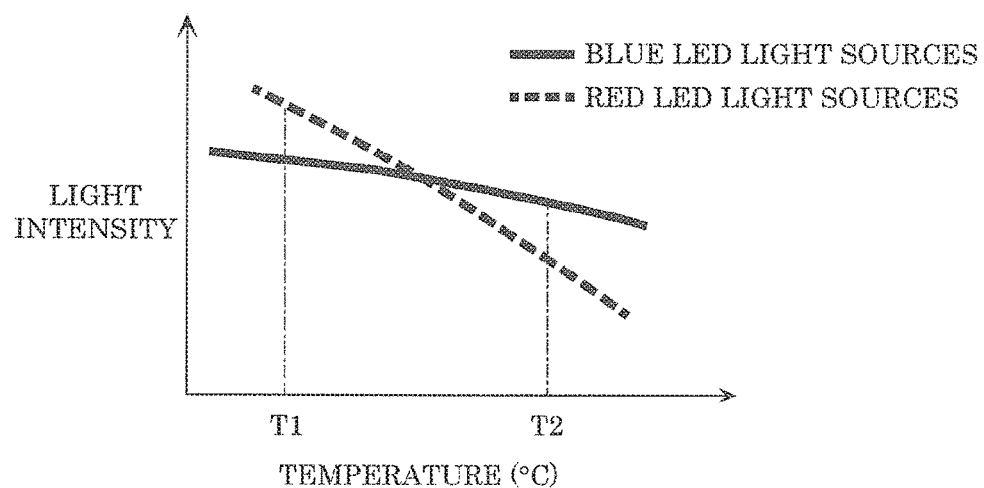
FIG. 5 is a graph illustrating temperature characteristics of a blue LED light source and a red LED light source included in the light-emitting module according to the embodiment.

FIG. 5 is a graph illustrating the temperature characteristics of blue LED light sources 12b and red LED light sources 12r. It should be noted that, in FIG. 5, the vertical axis represents the intensity of light emitted from blue LED light sources 12b and red LED light sources 12r, and the horizontal axis represents the ambient temperature around blue LED light sources 12b and red LED light sources 12r. Here, ambient temperature refers to the temperature of air in the vicinity of blue LED light sources 12b and red LED light sources 12r. When the ambient temperature changes, the temperature of blue LED light sources 12b and red LED light sources 12r also changes. Specifically, when the ambient temperature rises, the temperature of blue LED light sources 12b and red LED light sources 12r also rises. Furthermore, in FIG. 5, it is assumed that T2>T1. Furthermore, in FIG. 5, the temperature characteristic of blue LED light sources 12b is indicated by a solid line, and the temperature characteristic of red LED light source 12r is indicated by a broken line.

Furthermore, although described later, the blue LED light sources and the red LED light sources of light-emitting module 10 are sealed by a sealant. In this case, in this Specification, the ambient temperature is described as the temperature of air in the vicinity of light-emitting module 10. Furthermore, light intensity indicates the radiant energy of light, and watt (W), for example, is used as a unit.

As illustrated in FIG. 5, when the ambient temperature is T1, the light intensity of red LED light sources 12r is greater compared to the light intensity of blue LED light sources 12b. Furthermore, when the ambient temperature is T2, the light intensity of red LED light sources 12r is less compared to the light intensity of blue LED light sources 12b.

In other words, the amount of change in light intensity with respect to the change in ambient temperature is different between blue LED light sources 12b and red LED light sources 12r. Specifically, the attenuation of light intensity when ambient temperature rises is greater for red LED light sources 12r than for blue LED light sources 12b.

As such, by controlling the ambient temperature around blue LED light sources 12b and red LED light sources 12r, it becomes possible to change the ratio of light intensity between blue LED light sources 12b and red LED light sources 12r. Specifically, the ratio of light intensity between blue LED light sources 12b and red LED light sources 12r can be controlled by controlling the ambient temperature around blue LED light sources 12b and red LED light sources 12r, without adjusting the amount of power input to each of blue LED light sources 12b and red LED light sources 12r. In other words, in light-emitting module 10 in which blue LED light sources 12b and red LED light sources 12r are arranged, the ratio of light intensity between the blue light and the red light emitted by light-emitting module 10 can be controlled by controlling the ambient temperature around light-emitting module 10.

Furthermore, since there is no need to form circuits for separately driving blue LED light sources 12b and red LED light sources 12r in order to change the ratio of light intensity between blue LED light sources 12b and red LED light sources 12r, the structure of light-emitting module 10 is simplified. Furthermore, since and the light intensity of the red LED light source 12r can be controlled to change in conjunction with a change in the light intensity of the blue LED light source 12b, controlling the ratio becomes easy compared to when blue LED light source 12b and red LED light source 12r are controlled separately.

Furthermore, there are instances where it is favorable to increase the ratio of the light intensity of blue light to the light intensity of red light and raise the temperature of the cultivation environment, following the growth of plant P. In such a case, in order to increase the ratio of the light intensity of blue light to the light intensity of red light, the ambient temperature around light-emitting module 10 is raised, as described earlier. Specifically, by raising the ambient temperature around light-emitting module 10, the ambient temperature around plant P adjacent to light-emitting module 10 also rises, and thus is also suitable for the environmental temperature for cultivating plant P. Furthermore, for example, as in the case of plant cultivation device 300 illustrated in FIG. 1, in the case where the cultivation environment of plant P is separated from outdoor air by illumination apparatus 200, container 301, and support component 302, the environmental temperature for cultivating plant P can also be controlled.

It should be noted that illumination apparatus 200 may include a temperature sensor (not illustrated) which measures the ambient temperature, etc., around light-emitting modules 10 when the ambient temperature around light-emitting modules 10 is being controlled by light regulator 101. For example, light regulator 101 controls the ambient temperature around light-emitting modules 10 in accordance with the temperature measured by the temperature sensor. By doing so, the ratio between the light intensity of the blue light and the light intensity of the red light included in the light emitted by light-emitting module 10 can be controlled precisely regardless of the environmental temperature in the surroundings where light-emitting module 10 is disposed. The temperature sensor is, for example, a thermistor.

Furthermore, it is sufficient that light regulator 101 is capable of controlling the temperature of blue LED light source 12b and red LED light source 12r. For example, light regulator 101 may control the temperature of light-emitting modules 10 indirectly by heating or cooling the air in the vicinity of light-emitting modules 10.

For example, as described later, when each light-emitting module 10 includes a board, light regulator 101 may directly heat or cool the board, and the temperature sensor may measure the temperature of the board. Light regulator 101 determines the heating or cooling temperature according to the temperature of the board measured by the temperature sensor. Doing so enables the ratio between the light intensity of blue light and the light intensity of red light included in the light emitted by light-emitting module 10 to be controlled.

Furthermore, the temperature characteristics (see FIG. 5) of blue LED light sources 12b and red LED light sources 12r which have been defined by the ambient temperature, are, however, not limited to such. Their temperature characteristics may be defined by the temperature of blue LED light sources 12b and red LED light sources 12r. For example, their temperature characteristics may be defined by the junction temperature of the LED light sources, or may be defined by the case temperature of the light-emitting module. Here, in a COB light-emitting module, the case temperature is, for example, the temperature of the board on which the LED light sources are mounted.

Light-emitting modules 10 have been described up to this point. The specific configuration of light-emitting modules 10 will be described later.

Next, the ratio between the light intensity of blue light and the light intensity of red light will be described.

As described above, plant P includes in its cells chlorophyll which performs photosynthesis. Chlorophyll easily absorbs light in the blue range (blue light) of approximately at least 400 nm to at most 470 nm, and light in the red range (red light) of approximately at least 610 nm to at most 680 nm. Specifically, blue light and red light play an important role in the photosynthesis of plant P. In addition, the ratio of light amount between the blue light and the red light included in the light with which plant P is irradiated also plays an important role. Here, the peak light intensity of blue light and the peak light intensity of red light in the light-emission spectrum of light emitted from light-emitting modules 10 are defined as a first light intensity and a second light intensity, respectively. A specific example of the light-emission spectrum of light emitted from light-emitting modules 10 will be described later.

For example, in order to cause the lengthening of stems or the enlargement of leaves of plant P, plant P may be irradiated with light having a higher ratio of second light intensity to first light intensity. Specifically, in the relatively early half of the growth stage in the cultivation of plant P, plant P may be irradiated with light having a large amount of red light components in order to make plant P grow big. The ratio of second light intensity to first light intensity in the relatively earlier half of the growth stage in the cultivation of plant P is, for example, at least 4 and at most 10.

Furthermore, for example, in order to increase the number of buds, ripen the fruits, or increase the nutrient composition of plant P, plant P may be irradiated with light in which the light intensity of blue light is increased. In other words, in the relatively latter half of the growth stage in the cultivation of plant P, in order to increase the number of buds, ripen the fruits, or increase the nutrient composition of plant P, plant P may be irradiated with light in which the ratio of the second light intensity to the first light intensity has been reduced compared to that in the aforementioned earlier half of the growth stage. The ratio of second light intensity to first light intensity in the relatively latter half of the growth stage in the cultivation of plant P is, for example, at least 2 and at most 4.

Specifically, light regulator 101 may perform control so that the ratio of second light intensity to first light intensity immediately before the end of irradiation is lower than the ratio of second light intensity to first light intensity immediately after the start of irradiation by light-emitting modules 10. For example, light regulator 101 may control light-emitting modules 10 so that the ratio of second light intensity to first light intensity is at least 4 and at most 10 at the start of irradiation. Furthermore, light regulator 101 may control light-emitting modules 10 so that the ratio of second light intensity to first light intensity becomes at least 2 and at most 4 at the end of irradiation. By doing so, illumination apparatus 200 is capable of irradiating plant P with light suitable for the growth of plant P, in accordance with the growth stage of plant P.

It should be noted that it is assumed that the cultivation of plant P is already in the relatively latter half of the growth stage when use of illumination apparatus 200 is started. In this case, for example, clock 102 may start the measuring of the irradiation time after changing the total irradiation time in accordance with the growth stage of plant P.

The ratio between the light intensity of blue light and the light intensity of red light has been described up to this point.

[Configuration of Light-Emitting Module]

Figure 6:
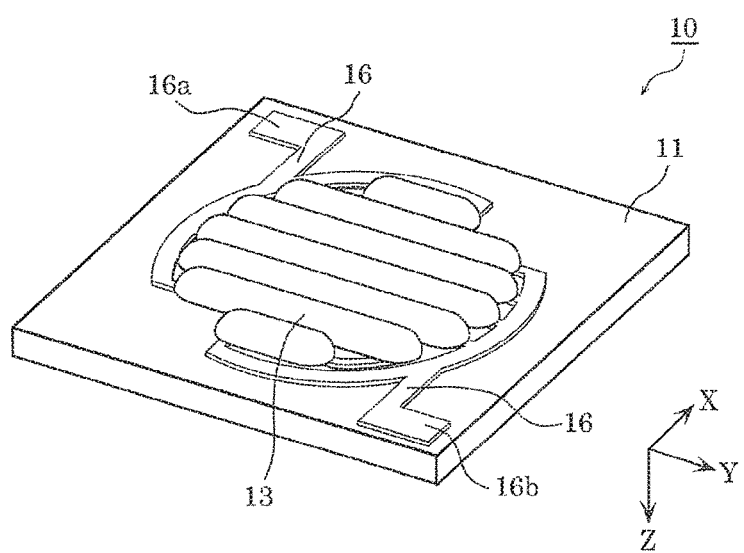
FIG. 6 is a perspective view of the external appearance of the light-emitting module according to the embodiment.
Figure 7:
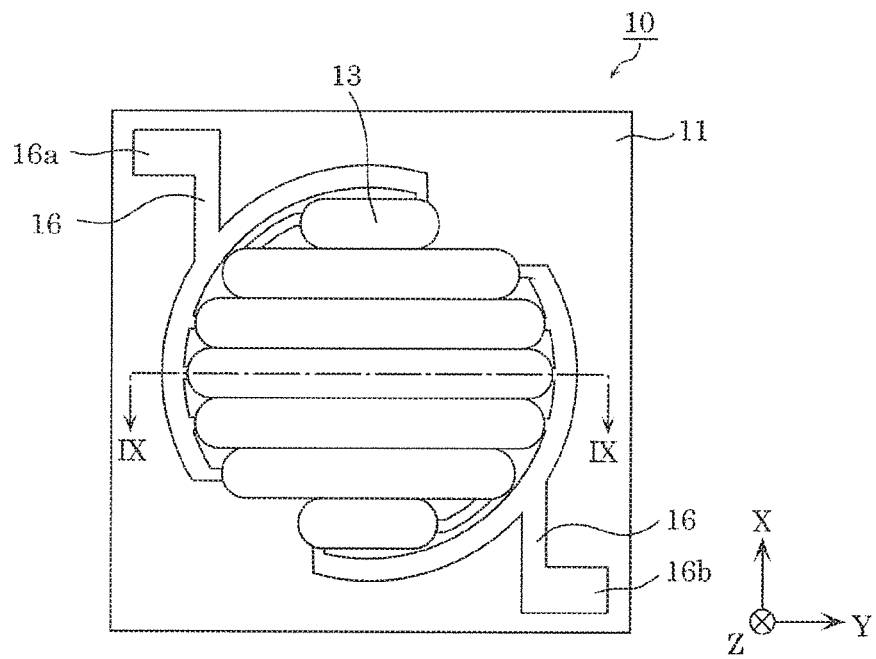
FIG. 7 is a plan view of the light-emitting module according to the embodiment.
Figure 8:
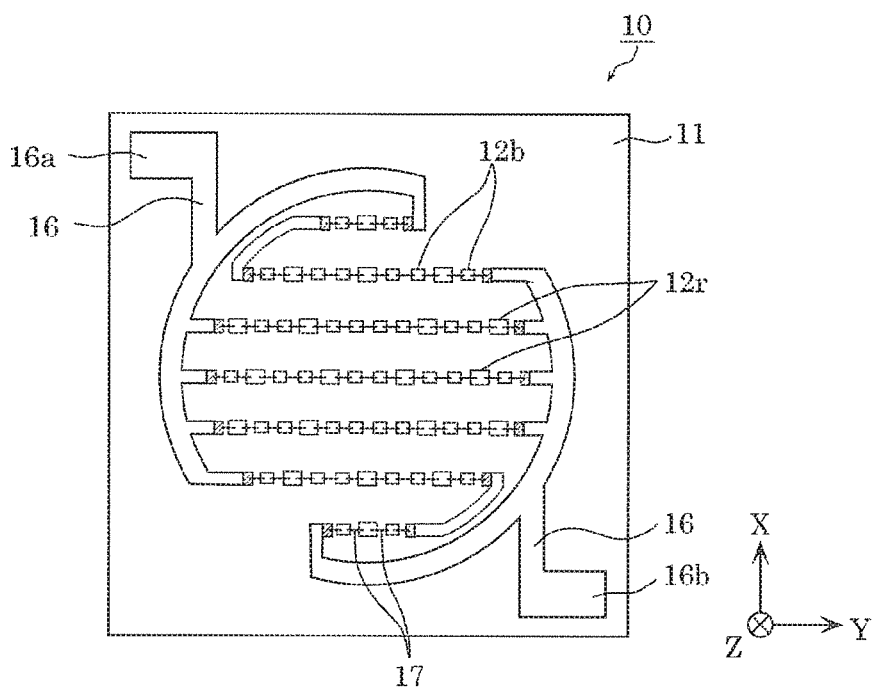
FIG. 8 is a plan view of the internal structure of the light-emitting module according to the embodiment.
Figure 9:
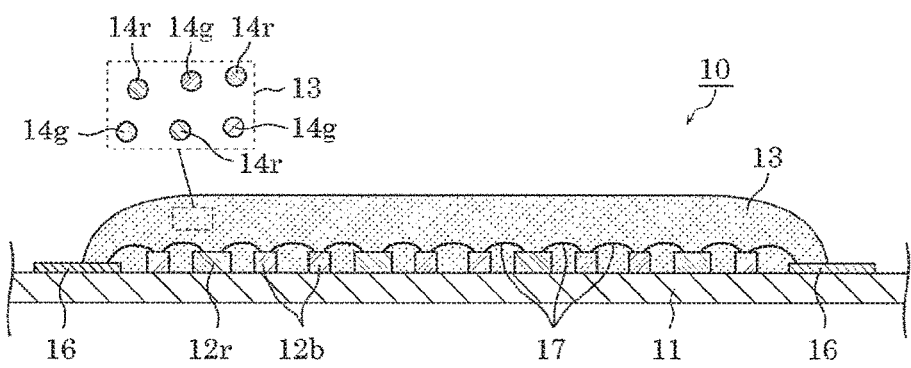
FIG. 9 is a schematic cross-sectional view of the light-emitting module along line IX-IX in FIG. 7.

Next, the specific configuration of the light-emitting modules according to this embodiment will be described with reference to FIG. 6 to FIG. 9. FIG. 6 is a perspective view of the external appearance of a light-emitting module according to this embodiment. FIG. 7 is a plan view of the light-emitting module according to this embodiment. FIG. 8 is a plan view of the internal structure of the light-emitting module according to this embodiment. FIG. 9 is a schematic cross-sectional view along line IX-IX in FIG. 6. It should be noted that FIG. 8 is a plan view in which sealant 13 is removed to show the internal structure such as the LED light source arrangement and wiring pattern.

As illustrated in FIG. 6 and FIG. 9, light-emitting module 10 according to this embodiment includes board 11, blue LED light sources 12*b*, red LED light sources 12*r*, and sealant 13.

Light-emitting module 10 is an LED module having what is called a COB structure in which blue LED light sources 12*b* and red LED light sources 12*r* are directly mounted on board 11.

Board 11 is a board having a wiring region in which wire 16 for supplying power to blue LED light sources 12*b* and red LED light sources 12*r* is provided. Wire 16 (as well as electrode 16*a* and electrode 16*b*) is formed using metal. Board 11 is, for example, a metal base board or a ceramic board. Furthermore, board 11 may be a resin board having resin as a base material.

As a ceramic board, an alumina board comprising aluminum oxide (alumina) or an aluminum nitride board comprising aluminum nitride, etc. is used. Furthermore, as a metal base board, for example, an aluminum alloy board, a ferroalloy board, or a copper alloy board, etc., on the surface of which an insulating film is formed is used. As a resin board, for example, a glass-epoxy board comprising glass fiber and epoxy resin, etc. is used.

It should be noted that, as board 11, a board having high optical reflectance (for example, an optical reflectance of at least 90%) may be used. By using a board having high optical reflectance for board 11, the light emitted by blue LED light sources 12*b* and red LED light sources 12*r* can be reflected off the surface of board 11. As a result, the light-extraction efficiency of light-emitting module 10 is improved. Such a board is exemplified by a white ceramic board having, for example, alumina as a base material.

Furthermore, as board 11, a light-transmissive board that is highly transmissive of light may be used. Such a board is exemplified by a light-transmissive ceramic board comprising polycrystalline alumina or aluminum nitride, a transparent glass board comprising glass, a crystal board comprising crystal, a sapphire board comprising sapphire, or a transparent resin board comprising a transparent resin material.

It should be noted that although board 11 is square in this embodiment, board 11 may be of a different shape such as circular.

Blue LED light sources 12*b* are LED light sources that emit blue light. Blue LED light sources 12*b* are formed using, for example, a InGaN-based material. The light emission peak wavelength of blue LED light sources 12*b* is, for example, in a range of at least 400 nm to at most 470 nm.

Red LED light sources 12*r* are LED light sources that emit red light. Red LED light sources 12*r* are formed using, for example, an AlGaInP-based material. The light emission peak wavelength of red LED light sources 12*r* is, for example, in a range of at least 610 nm to at most 680 nm.

A plurality of light-emitting element columns each including a plurality of LED light sources are provided on board 11. As illustrated in FIG. 8, structurally, seven light-emitting element columns arranged along the X-axis direction are provided on board 11.

Electrically, five light-emitting element columns each including 12 LED chips connected in series are provided on board 11. The five light-emitting element columns are connected in parallel, and emit light when power is supplied between electrode 16*a* and electrode 16*b*.

Furthermore, one light-emitting element column out of the five light-emitting element columns includes at least one each of blue LED light sources 12*b* and red LED light sources 12*r*. In other words, in one of the light-emitting element columns, a blue LED light source 12*b* and a red LED light source 12*r* are connected in series. In addition, one light-emitting element column includes the same number of blue LED light source 12*b* and the same number of red LED light source 12*r* as the other light-emitting element columns. Accordingly, the total Vf of the LED light sources in each of the light-emitting element columns can be made uniform, and the configuration of the lighting device for causing light-emitting module 10 to light up can be simplified.

Furthermore, red LED light sources 12*r* may be dispersed so that one of red LED light sources 12*r* is not adjacent to another one of red LED light sources 12*r* in both the X-axis direction and the Y-axis direction. With this, light-emitting device 10 is capable of emitting light with uniform redness.

Furthermore, LED light sources that are connected in series are mainly connected chip-to-chip by bonding wire 17 (part of the LED light sources is connected to wire 16). Bonding wire 17 is a power supply wire connected to the LED light sources. It should be noted that gold (Au), silver (Ag), or copper (Cu), for example, is used as the metal material for bonding wire 17 as well as aforementioned wire 16, electrode 16*a*, and electrode 16*b*. It should be noted that although details are not illustrated in the figures, wire 16 is covered by a resist film.

Sealant 13 is a sealing material which seals the LED light sources. More specifically, sealant 13 seals each of the seven light-emitting element columns arranged along the X-axis direction, in the shape of a line following the light-emitting element column. In other words, blue LED light sources 12*b* and red LED light sources 12*r* are collectively sealed by a light-transmissive resin (sealant 13). Sealant 13 has a function of protecting blue LED light sources 12b and red LED light sources 12r. It should be noted that bonding wire 17 and part of wire 16 are also sealed by sealant 13.

Although a methyl-based silicone resin, for example, is used as the light-transmissive resin that becomes the base material of sealant 13, an epoxy resin or a urea resin may be used.

Furthermore, sealant 13 may contain green phosphor 14g and red phosphor 14r. In other words, blue LED light sources 12b and red LED light sources 12r are collectively sealed by a light-transmissive resin (sealant 13) containing green phosphor 14g and red phosphor 14r.

For example, when illumination apparatus 200 is used at home, the appearance of light emitted from illumination apparatus 200 is important. If the light emitted from illumination apparatus 200 is composed of only blue light and red light that are suited to plant cultivation, a violet light will be emitted. If a user looks at a plant that is irradiated with the violet light, the color of the plant would appear bad because a green light component is not included. As such, the violet light is not suitable for viewing plants.

Furthermore, for example, in the case where illumination apparatus 200 is used in a plant factory, etc., if the light emitted from illumination apparatus 200 is composed of only blue light and red light that are suited to plant cultivation, there is the risk that it may become difficult for the user to perceive plant diseases, etc.

As such, the light emitted from illumination apparatus 200 may be made to approximate white light by including phosphors in sealant 13. Specifically, the phosphor content of sealant 13 may be adjusted so that the chromaticity of the light emitted from illumination apparatus 200 approximates a black body locus.

Green phosphor 14g emits light when excited by light emitted by blue LED light sources 12b. Green phosphor 14g is, for example, a $Y_3(Al, Ga)_5O_{12}:Ce^{3+}$ phosphor or a $Lu_3Al_5O_{12}:Ce^{3+}$ phosphor, which has a light emission peak wavelength of at least 515 nm to at most 550 nm.

Red phosphor 14r emits light when excited by the light emitted by blue LED light sources 12b. Red phosphor 14r is, for example, a $CaAlSiN_3:Eu^{2+}$ phosphor which has a light emission peak wavelength of at least 640 nm to at most 670 nm, but may be a $(Sr, Ca)AlSiN_3:Eu^{2+}$ phosphor, etc.

Then, through the mixing of the blue light that is not absorbed by green phosphor 14g and red phosphor 14r, the green light emitted by green phosphor 14g, the red light emitted by red phosphor 14r, and the red light emitted by red LED light sources 12r, light-emitting module 10 emits white light.

In this manner, by containing green phosphor 14g and red phosphor 14r, sealant 13 functions as a wavelength converter.

It should be noted that adding phosphor to sealant 13 may affect the wavelength range of at least 400 nm to at most 470 and the wavelength range of at least 610 nm to at most 680 nm in the light emission spectrum of the light emitted from light-emission module 10. In this case, the number of LED light sources that are provided in light-emitting module 10 and/or the amount of phosphor contained in sealant 13 may be adjusted as appropriate so that the ratio between the light intensity at the light emission peak of blue light and the light intensity at the light emission peak of red light are in the desired range.

Here, in light-emission module 10, part of the blue light emitted by blue LED light sources 12b is wavelength-converted to green light by green phosphor 14g contained in sealant 13. Furthermore, part of the blue light emitted by blue LED light sources 12b is wavelength-converted to red light by red phosphor 14r contained in sealant 13. In other words, the above-described phosphors wavelength-convert part of the blue light emitted by blue LED light sources 12b. As such, more blue LED light sources 12b may be provided than red LED light sources 12r. Furthermore, the phosphors may be contained in sealant 13 so as to be located at least around blue LED light sources 12b. By doing so, it becomes easy for the light emitted from light-emitting module 10 to approximate white light.

It should be noted that sealant 13 may contain a yellow phosphor instead of green phosphor 14g and/or red phosphor 14r or in addition to green phosphor 14g and/or red phosphor 14r. The yellow phosphor is, for example, a yttrium aluminum garnet (YAG)-based phosphor having a light emission peak wavelength of at least 550 nm to at most 570 nm.

Figure 10:
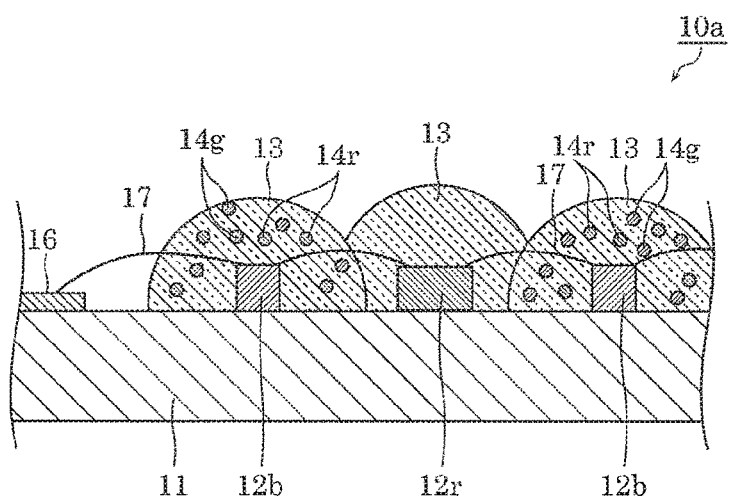
FIG. 10 is a schematic cross-sectional view of a light-emitting module according to another embodiment, corresponding to line IX-IX in FIG. 7.

FIG. 10 is a schematic cross-sectional view of a light-emitting module according to another embodiment, corresponding to line IX-IX in FIG. 7. It should be noted that FIG. 10 is a schematic cross-section illustrating a portion of a cross-section corresponding to line IX-IX in FIG. 7. Furthermore, FIG. 10 is a diagram schematically illustrating the state in which the respective LED light sources are individually sealed by sealant 13.

As illustrated in FIG. 10, respective blue LED light sources 12b and red LED light sources 12r are individually sealed by sealants 13. Furthermore, sealants 13 which seal blue LED light sources 12b contain phosphors (for example, green phosphor 14g and red phosphor 14r). However, sealants 13 which seal red LED light sources 12r do not contain phosphors.

This facilitates the wavelength-conversion of part of the blue light emitted by blue LED light sources 12b by the phosphors contained in sealants 13.

It should be noted when adjacent LED elements consist of successively disposed blue LED light sources 12b or red LED light sources 12r, successive blue LED light sources 12b may be continuously sealed by sealant 13 containing phosphors or successive red LED light sources 12r may be sealed by sealant 13 not containing phosphors.

Light-emitting module 10 according to the foregoing embodiments has been described up to this point.

[Light Emission Spectrum]

As previously described, light-emitting module 10 emits a composite light of the light emitted from blue LED light sources 12b, red LED light sources 12r, and the phosphors. Next, specific examples of light emission spectra corresponding to ambient temperatures around light-emitting module 10 will be described.

Figure 11:
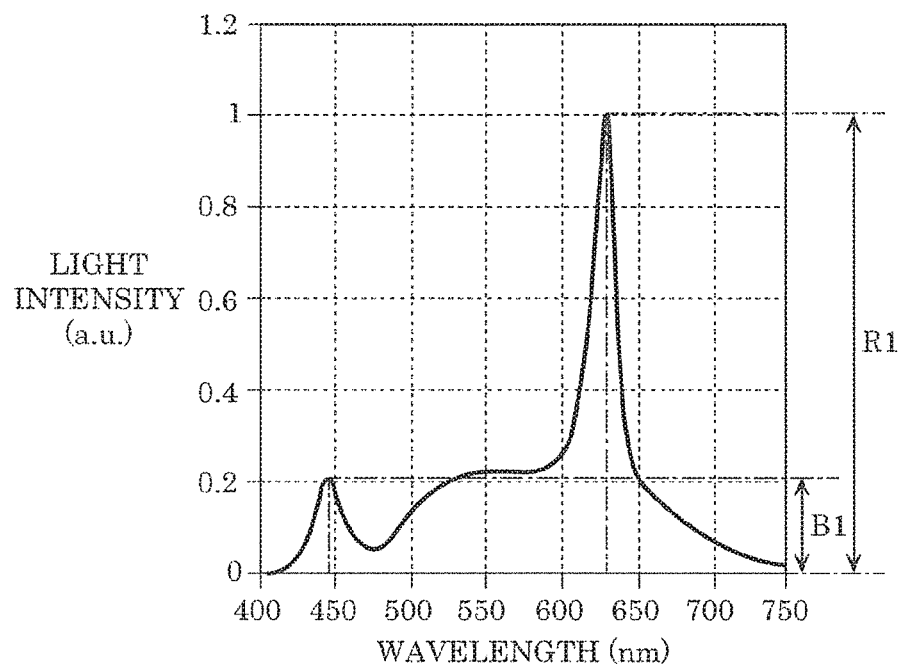
FIG. 11 is a graph illustrating a light emission spectrum in the case where the ambient temperature around the light-emitting module according to the embodiment is T1.
Figure 12:
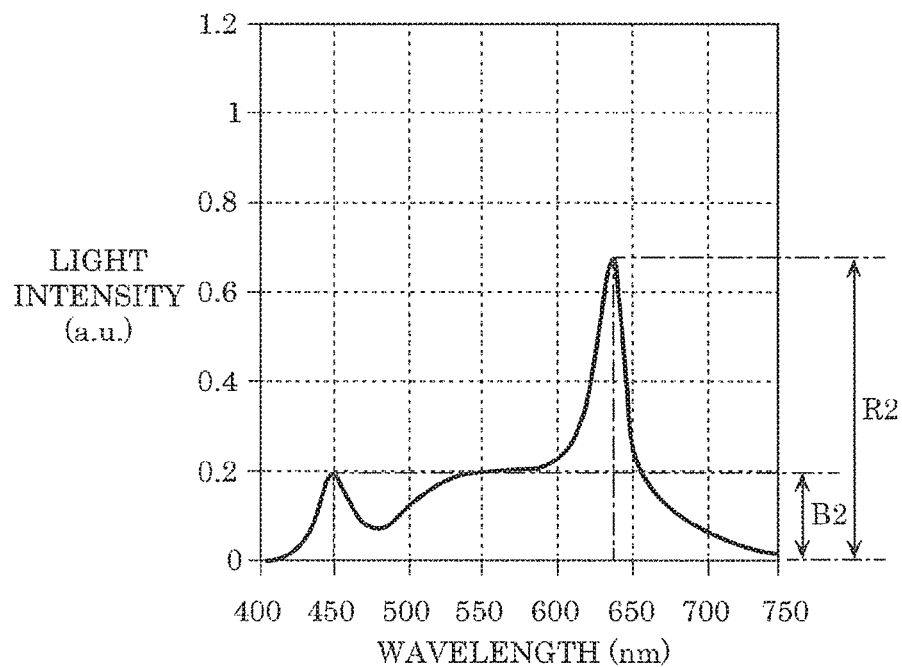
FIG. 12 is a graph illustrating a light emission spectrum in the case where the ambient temperature around the light-emitting module according to the embodiment is T2.

FIG. 11 is a graph illustrating a light emission spectrum in the case where the ambient temperature around the light-emitting module according to the embodiment is T1. FIG. 12 is a graph illustrating a light emission spectrum in the case where the ambient temperature around the light-emitting module according to the embodiment is T2. Specifically, the light emission spectra in FIG. 11 and FIG. 12 are the spectra of light emitted from the same light-emitting module 10. The spectral shapes are different because the ambient temperature around light-emitting module 10 is different. It should be noted that the vertical axes for the light emission spectra illustrated in FIG. 11 and FIG. 12 represent light intensity, and the horizontal axes represent wavelength. Furthermore, the light emission spectra illustrated in FIG. 11 and FIG. 12 are normalized by the radiant energy of light at the light emission spectrum peak (second light intensity) in the vicinity of 650 nm illustrated in FIG. 11. Furthermore, with regard to T1 and T2, T2>T1 as illustrated in FIG. 5.

FIG. 11 illustrates the light emission spectrum of light-emitting module 10 when the ambient temperature around light-emitting module 10 is T1=10° C. (junction temperature of LED light sources is 21° C.).

The light emission spectrum peak (first light intensity) in the vicinity of 450 nm illustrated in FIG. 11 is the light emission peak of blue LED light sources 12b. Furthermore, the light emission spectrum peak (second light intensity) in the vicinity of 650 nm illustrated in FIG. 11 is the light emission peak of red LED light sources 12r. The portion obtained by excluding the above-described light emission at the light emission peak of blue LED light sources 12b and red LED light sources 12r in the light emission spectrum in FIG. 11 is the light emission from the phosphors included in light-emitting module 10.

Here, the first light intensity and the second light intensity in the light emission spectrum of the light emitted from light-emitting module 10 are denoted as B1 and R1, respectively. As illustrated in FIG. 11, the ratio between aforementioned B1 and R1 is B1:R1≈1:4.7. In other words, the ratio of the second light intensity to the first light intensity in the light emission spectrum illustrated in FIG. 11 is 4.7.

FIG. 12 illustrates the light emission spectrum of light-emitting module 10 when the ambient temperature around light-emitting module 10 is T2=70° C. (junction temperature of LED light sources is 82° C.).

The light emission spectrum peak (first light intensity) in the vicinity of 450 nm illustrated in FIG. 12 is the light emission peak of blue LED light sources 12b. Furthermore, the light emission spectrum peak (second light intensity) in the vicinity of 650 nm illustrated in FIG. 12 is the light emission peak of red LED light sources 12r. The portion excluding the above-described light emission at the light emission peak of blue LED light sources 12b and red LED light sources 12r in the light emission spectrum in FIG. 12 is the light emission from the phosphors included in light-emitting module 10.

Here, the first light intensity and the second light intensity in the light emission spectrum of the light emitted from light-emitting module 10 are denoted as B2 and R2, respectively. As illustrated in FIG. 12, the ratio between aforementioned B2 and R2 is B2:R2≈1:3.5. In other words, the ratio of the second light intensity to the first light intensity in the light emission spectrum illustrated in FIG. 12 is 3.5.

As described above, changing the ambient temperature around light-emitting module 10 causes the light intensity at the light emission peak of blue LED light sources 12b and the light intensity at the light emission peak of red LED light sources 12r of light-emitting module 10 to change. As such, the ratio between the light intensity in the blue wavelength range and the light intensity in the red wavelength range of light-emission modules 10 can be changed.

The spectrum of the light emitted from light-emitting modules 10 has been described up to this point.

Next, the operation with respect to time of illumination system 100 including light-emitting modules 10 described above will be described.

Figure 13:
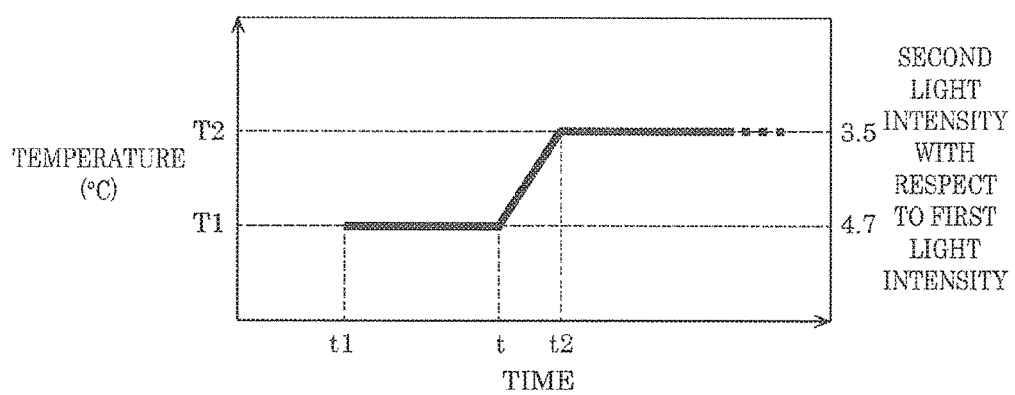
FIG. 13 is a graph illustrating temperatures of the light-emitting module according to the embodiment at predetermined timepoints.

FIG. 13 is a graph illustrating temperatures of the light-emitting module according to this embodiment at predetermined timepoints. Specifically, FIG. 13 is a graph in which the horizontal axis represents time and the vertical axes represent the temperature of light-emitting module 10 and the ratio of the second light intensity to the first light intensity of the light emitted by light-emitting module 10 at that time. Here, the temperature of the light-emitting module indicates any one of the ambient temperature, the case temperature, or the junction temperature of light-emitting module 10, as described earlier.

A specific example of the operation of illumination system 100 will be described using plant cultivation device 300 including illumination apparatus 200 illustrated in FIG. 1 and the graph illustrated in FIG. 13.

In plant cultivation device 300, first, plant P is planted in medium 303. Next, light-emitting modules 10 of illumination apparatus 200 are driven (lit up) to thereby irradiate plant P with light. Here, when the irradiation of light by light-emitting modules 10 is started, clock 102 starts the measuring of time. Here, the timepoint at which clock 102 starts measuring the time is denoted as first timepoint t1. As illustrated in FIG. 13, for example, the temperature of each light-emitting module 10 at first timepoint t1 is T1. Furthermore, the ratio of the second light intensity to the first light intensity of the light emitted by light-emitting module 10 at first timepoint t1 is 4.7. Stated differently, light regulator 101 heats or cools board 11 of light-emitting module 10 so that the temperature of light-emitting module 10 becomes T1.

After a predetermined time that is stored in advance in memory 103 elapses, clock 102 informs light regulator 101 that the time has elapsed. For example, the timepoint after the elapse of the predetermined time described above is denoted as timepoint t. Light regulator 101 controls the temperature of light-emitting module 10 when timepoint t is reached to thereby control the ratio between the first light intensity and the second light intensity of the light emitted from light-emitting module 10. Specifically, light regulator 101 heats or cools board 11 of light-emitting module 10 so that the desired ratio between the first light intensity and the second light intensity (3.5 in FIG. 13) is obtained at second timepoint t2.

As illustrated in FIG. 13, for example, the temperature of light-emitting module 10 at second timepoint t2 is T2. Furthermore, the ratio of the second light intensity to the first light intensity of the light emitted by light-emitting module 10 at second timepoint is 3.5. Stated differently, light regulator 101 heats or cools board 11 of light-emitting module 10 so that the temperature of light-emitting module 10 at timepoint t2 becomes T2.

Specifically, light regulator 101 performs control to raise the temperature of board 11 of light-emitting module 10 to cause the ratio of the second light intensity to the first light intensity of light-emitting module 10 at first timepoint t1 to be higher than the ratio of the second light intensity to the first light intensity at second timepoint t2 after first timepoint t1.

The operation in which light regulator 101 controls the temperature of light-emitting module 10 after the predetermined time described above elapses, is repeated by clock 102 and light regulator 101 a predetermined number of times which is stored in advance in memory 103. Accordingly, by referring to the irradiation time measured by clock 102, light regulator 101 can irradiate plant P with light suitable for the growth of plant P, in accordance with the growth stage of plant P.

It should be noted that the timepoint at which clock 102 starts measuring the time is not particularly limited and may be directly instructed by the user. For example, the user inputs information on the start time, the end time, and the growth stage of the plant via an input interface (not illustrated) provided in plant cultivation device 300. Light regulator 101 may regulate the ratio between the first light intensity and the second light intensity of the light with which the plant is irradiated, in accordance with the information. Clock 102 may start the measurement of the irradiation time after changing the total irradiation time in accordance with the information.

Furthermore, at timepoint t illustrated in FIG. 13, light regulator 101 controlled the ratio between the first light intensity and the second light intensity of the light emitted by light-emitting module 10 by controlling the temperature of light-emitting module 10. Specifically, as illustrated in FIG. 13, the ratio of the second light intensity to the first light intensity of the light emitted from light-emitting module 10 from first timepoint t1 to timepoint t is constant but is not limited to being such. Light regulator 101 may gradually raise the temperature of light-emitting module 10 with the passing of time to thereby cause the ratio between the first light intensity and the second light intensity of the light emitted from light-emitting module 10 to change gradually.

A specific example of the operation of plant cultivation device 300 including illumination apparatus 200 has been described up to this point.

CONCLUSION

Illumination system 100 according to the foregoing embodiments includes light-emitting modules 10 each of which has blue LED light sources 12b which emit blue light and red LED light sources 12r which emit red light. Blue LED light sources 12b emit blue light having a light emission peak in a blue range of at least 400 nm to at most 470 nm. Red LED light sources 12r emit red light having a light emission peak in a red range of at least 610 nm to at most 680 nm. Furthermore, illumination system 100 includes: light regulator 101 which controls a first light intensity and a second light intensity which are the light intensity at the light emission peak in the blue range and the light intensity at the light emission peak in the red range, respectively, in the light emission spectrum of light emitted by light-emitting modules 10; and clock 102 which measures a time. Furthermore, light regulator 101 causes the second light intensity of the light-emitting module 10 to change in conjunction with a change in the first light intensity, in accordance with the time measured by clock 102.

Accordingly, the ratio between the first light intensity and the second light intensity is changed by causing the second light intensity to change in conjunction with a change in the first light intensity, in accordance with the time measured by clock 102. As such, illumination system 100 can, with a simple configuration, irradiate plant P with light having a ratio between the first light intensity and the second light intensity that is in accordance with the growth stage of plant P.

Furthermore, light regulator 101 may control light-emitting module 10 to cause the ratio of the second light intensity to the first light intensity at a first time point to be higher than the ratio of the second light intensity to the first light intensity at a second time point after the first timepoint.

For example, in order to cause the lengthening of stems or the enlargement of leaves of plant P, plant P may be irradiated with light in which the ratio of the second light intensity is higher than the ratio of the first light intensity. In other words, when it is desired to make plant P grow big in the relatively early half of the growth stage of plant P, plant P may be irradiated with light in which the ratio of the second light intensity to the first light intensity is high.

Furthermore, for example, in order to increase the number of buds, ripen the fruits, or increase the nutrient composition of plant P, plant P may be irradiated with light in which the light intensity of blue light is increased. In other words, in the relatively latter half of the growth stage in the cultivation of plant P, in order to increase the number of buds, ripen the fruits, or increase the nutrient composition of plant P, plant P may be irradiated with light in which the ratio of the second light intensity to the first light intensity has been reduced compared to that in the aforementioned earlier half of the growth stage. In other words, plant P requires a different color component depending on the stage of growth.

Therefore, by controlling the ratio between the first light intensity and the second light intensity in accordance with the growth stage of plant P as described above, illumination system 100 can irradiate plant P with light that is suited to the cultivation of plant P, in accordance with the growth stage of plant P.

Furthermore, the light regulator may control the light-emitting module to cause the ratio of the second light intensity to the first light intensity to be at least 4 and at most 10 at the first timepoint, and may control the light-emitting module to cause the ratio of the second light intensity to the first light intensity to be at least 2 and at most 4 at the second timepoint. Furthermore, light-emitting module 10 may include a sealant that seals blue LED light sources 12b and red LED light sources 12r, and at least the sealant that seals blue LED light sources 12b may contain phosphor that converts a wavelength of the blue light.

Specifically, for example, since it is desired to make plant P grow big in the early half of the growth stage of plant P, the ratio of the second light intensity to the first light intensity of the light emitted by light-emitting modules 10 may be at least 4 and at most 10. Furthermore, as described above, since it is desired to increase the number of buds, ripen the fruits, or increase the nutrient composition of plant P in the latter half of the growth stage of plant P, the ratio of the second light intensity to the first light intensity of the light emitted by light-emitting modules 10 may at least 2 and at most 4.

By doing so, illumination system 100 can irradiate plant P with light that is suited to the cultivation of plant P, in accordance with the growth stage of plant P.

Light that includes only the blue light and the red light suitable for the cultivation of plant P, however, does not become white light. In other words, the color of plant P which is irradiated with such a light would look bad. As such, there is a risk that an unpleasant feeling may be imparted to a user seeing plant P which is irradiated with such a light.

In view of this, light-emitting modules 10 according to the foregoing embodiments may further include phosphors. Specifically, light-emitting modules 10 may include phosphors so that the light emitted by light-emitting modules 10 becomes a natural white light. By doing so, it is possible to prevent the color of plant P which is irradiated with the light emitted from light-emitting modules 10 from looking bad. As such, it is possible to prevent the unpleasant feeling when the user looks at plant P irradiated with such light.

Furthermore, the central wavelength of light emitted by the LED light sources tends to be uneven due to problems in the manufacturing of the LED light sources. As such, with light-emitting modules including a light-emitting component having only LED light sources without using phosphors, it is difficult to make the chromaticity of respective light-emitting modules uniform.

However, compared to LED light sources, phosphors tend to have a uniform light-emission central wavelength and a broad light-emission spectrum. As such, for example, when phosphor is used in light-emitting modules 10, the chromaticity of light emitted by light-emitting modules 10 tends to be uniform. In other words, by using phosphors, it is possible to manufacture light-emitting modules 10 having high reproducibility for emitting light having the desired chromaticity.

Furthermore, light-emitting module 10 may include more blue LED light sources 12*b* than red LED light sources 12*r*.

For example, when light-emitting modules 10 include phosphors, part of the blue light emitted by blue LED light sources 12*b* is wavelength-converted. As such, in order that light having a predetermined ratio between the first light intensity and the second light intensity is emitted from light-emitting modules 10, it is necessary to have more blue light, that is, more blue LED light sources 12*b* compared to when light-emitting modules 10 do not include phosphors. In other words, in order that the light having the aforementioned ratio of the second light intensity to the first light intensity is emitted from light-emitting modules 10, more blue LED light sources 12*b* than red LED light sources 12*r* may be provided.

This makes it easier for the light emitted from light-emitting modules 10 to approximate white light.

Furthermore, light regulator 101 may control the temperature of light-emitting module 10 to cause the second light intensity to change in conjunction with a change in the first light intensity.

Accordingly, the ratio between the first light intensity and the second light intensity can be controlled to a desired ratio by controlling the temperature of light-emitting modules 10, without adjusting the amount of power input to each of blue LED light sources 12*b* and red LED light sources 12*r*.

Furthermore, light-emitting module 10 may include board 11, and blue LED light sources 12*b* and red LED light sources 12*r* may be disposed on board 11. Furthermore, light-emitting module 10 may control the temperature of board 11 to cause the second light intensity to change in conjunction with a change in the first light intensity.

Accordingly, the ratio between the first light intensity and the second light intensity can be controlled to a desired ratio by controlling the temperature of board 11 of light-emitting modules 10, without adjusting the amount of power input to each of blue LED light sources 12*b* and red LED light sources 12*r*.

Furthermore, light-emitting module 10 may include at least one light-emitting element column in which blue LED light source 12*b* and red LED light source 12*r* are connected in series.

Accordingly, the blue light and the red light emitted from light-emitting module 10 tend not to be spatially separated. As such, color unevenness of the light emitted from light-emitting modules 10 is reduced.

Furthermore, an illumination control method according to the foregoing embodiments includes lighting-up light-emitting modules 10 each of which has blue LED light sources 12*b* which emit blue light and red LED light sources 12*r* which emit red light. Blue LED light sources 12*b* emit blue light having a light emission peak in a blue range of at least 400 nm to at most 470 nm. Red LED light sources 12*r* emit red light having a light emission peak in a red range of at least 610 nm to at most 680 nm. Furthermore, the illumination control method according to the foregoing embodiments further includes measuring a time from a timepoint at which the lighting-up is executed. Furthermore, the illumination control method according to the foregoing embodiments further includes controlling a temperature of light-emitting modules 10 in accordance with the time measured in the measuring, to cause a light intensity at the light emission peak in the red color to change in conjunction with a change in a light intensity at the light emission peak of the blue light.

Accordingly, the ratio of light intensity between blue LED light sources 12*b* and red LED light sources 12*r* can be controlled by controlling the temperature of light-emitting module 10, without adjusting the amount of power input to each of blue LED light sources 12*b* and red LED light sources 12*r*. As such, using a simple method, plant P is irradiated with light having a ratio between the light intensity of blue light and the light intensity of red light that is in accordance with the growth stage of plant P.

Furthermore, plant cultivation device 300 according to the foregoing embodiments includes illumination system 100, and container 301 that holds medium 303 which supports plant P. In addition, light-emitting module 10 irradiates plant P, which is supported by medium 303 held by container 301, with light.

Specifically, illumination system 100 having the above-described advantageous effects is, for example, applied to plant cultivation device 300 for cultivation of plants. The ratio between the first light intensity and the second light intensity is changed by causing the second light intensity to change in conjunction with a change in the first light intensity, in accordance with the time measured by clock 102. As such, illumination system 300 can, with a simple configuration, irradiate plant P with light having a ratio between the first light intensity and the second light intensity that is in accordance with the growth stage of plant P.

[Others]

Although the illumination system, illumination control method, and plant cultivation device according to the foregoing embodiments have been described thus far, the present disclosure is not limited to the foregoing embodiments.

In the foregoing embodiments, the light regulator controls the temperature of the light-emitting modules to thereby control the light emission spectrum of the light emitted by the light-emitting modules. The light regulator is realized, for example, using a Peltier element, but is not limited to such. The light regulator may be configured from, for example, a fan for cooling the light-emitting modules and a heater for heating the light-emitting modules. In other words, the light regulator may separately include a heating device and a cooling device for the light-emitting modules.

Furthermore, since the LED light sources also generate heat when emitting light, the temperature of the LED sources rises. In other words, when raising the temperature in order to cause the spectrum of the light-emitting modules to change, the self-generation of temperature by the LED light sources may be utilized. As such, the light regulator need not include a heating device.

Furthermore, for example, although light-emitting modules having a COB structure were described in the foregoing embodiments, the light-emitting module according to the present disclosure may be realized as a light-emitting module that includes surface mount device (SMD) light-emitting elements. It should be noted that an SMD light-emitting element includes, for example, a resin container having a concave portion, an LED light source mounted inside the concave portion, and a sealant (phosphor-containing resin) that fills the inside of the concave portion.

Furthermore, the light-emitting modules according to the present disclosure may be realized as remote-phosphor light-emitting modules in which a resin material containing phosphor is disposed at a position that is away from the LED light sources. Furthermore, there is no particular limitation on the shape, structure, and size of the light-emitting modules according to the present disclosure, as long as the light-emitting modules according to the present disclosure satisfies the spectrum conditions described in the foregoing embodiments.

Furthermore, in the foregoing embodiments, an LED light source mounted on the board is connected chip-to-chip to another LED light source by a bonding wire. However, an LED light source may be connected by a bonding wire to a wire (metal film) provided on the board, and electrically connected to another LED light source via the wire.

Furthermore, in the foregoing embodiments, the blue LED and red LED light intensity control is implemented through software by having the light regulator include a CPU, and having the CPU execute a program. However, the implementation method is not limited to such, and the control may be implemented through hardware by using a dedicated electronic circuit using a gate array, etc.

Aside from the above, forms obtained by various modifications to the respective exemplary embodiments that can be conceived by a person of skill in the art as well as forms realized by arbitrarily combining structural components and functions in the respective exemplary embodiments which are within the scope of the essence of the present disclosure are included in the present disclosure.

What is claimed is:

1. An illumination system, comprising:
   a light-emitting module including a blue light-emitting diode (LED) light source that emits blue light and a red LED light source that emits red light, the blue light having a light emission peak in a blue range of at least 400 nm to at most 470 nm, the red light having a light emission peak in a red range of at least 610 nm to at most 680 nm;
   a light regulator that controls a first light intensity and a second light intensity in a light emission spectrum of light emitted by the light-emitting module, the first light intensity being a light intensity at the light emission peak in the blue range, and the second light intensity being a light intensity at the light emission peak in the red range; and
   a clock that measures a time, wherein
   the light regulator:
      causes the second light intensity to change in conjunction with a change in the first light intensity, in accordance with the time measured by the clock; and
      controls the light-emitting module to cause a ratio of the second light intensity to the first light intensity at a first timepoint to be higher than the ratio of the second light intensity to the first light intensity at a second timepoint after the first timepoint.

2. The illumination system according to claim 1, wherein the light regulator:
   controls the light-emitting module to cause the ratio of the second light intensity to the first light intensity to be at least 4 and at most 10 at the first timepoint; and
   controls the light-emitting module to cause the ratio of the second light intensity to the first light intensity to be at least 2 and at most 4 at the second timepoint,
   the light-emitting module includes a sealant that seals the blue LED light source and the red LED light source, and
   at least the sealant that seals the blue LED light source contains phosphor that converts a wavelength of the blue light.

3. The illumination system according to claim 2, wherein the phosphor converts the wavelength of the blue light to emit fluorescence of a color selected from at least one of green, red, and yellow.

4. The illumination system according to claim 1, wherein the light-emitting module includes a greater number of blue LED light sources than red LED light sources.

5. The illumination system according to claim 1, wherein the light regulator controls a temperature of the light-emitting module to cause the second light intensity to change in conjunction with the change in the first light intensity.

6. The illumination system according to claim 5, wherein the light-emitting module further includes a board,
   the blue LED light source and the red LED light source are disposed on the board, and
   the light regulator controls a temperature of the board to cause the second light intensity to change in conjunction with the change in the first light intensity.

7. The illumination system according to claim 5, wherein the light regulator includes at least one of a heating device and a cooling device for causing the temperature of the light-emitting module to change.

8. The illumination system according to claim 5, wherein the light regulator includes a Peltier element.

9. The illumination system according to claim 5, wherein the light regulator causes the second light intensity to change in conjunction with the change in the first light intensity, without changing input power to the blue LED light source and the red LED light source.

10. The illumination system according to claim 1, wherein the light-emitting module includes at least one light-emitting element column in which the blue LED light source and the red LED light source are connected in series.

11. An illumination control method, comprising:
    lighting-up a light-emitting module including a blue LED light source that emits blue light and a red LED light source that emits red light, the blue light having a light emission peak in a blue range of at least 400 nm to at most 470 nm, the red light having a light emission peak in a red range of at least 610 nm to at most 680 nm;
    measuring a time from a timepoint at which the lighting-up is executed; and
    causing a light intensity at the light emission peak of the red light to change in conjunction with a change in a light intensity at the light emission peak of the blue light, by controlling a temperature of the light-emitting module, in accordance with the time measured in the measuring.

12. A plant cultivation device, comprising:
    the illumination system according to claim 1; and
    a container that holds a medium which supports a plant, wherein
    the light-emitting module irradiates the plant with the light.

* * * * *